US012644917B2

(12) United States Patent
Patki

(10) Patent No.: US 12,644,917 B2
(45) Date of Patent: Jun. 2, 2026

(54) RIG FOR COMPARING WIRE HARNESSES

(71) Applicant: Sandeep Suhas Patki, Pune (IN)

(72) Inventor: Sandeep Suhas Patki, Pune (IN)

( * ) Notice: Subject to any disclaimer, the term of this patent is extended or adjusted under 35 U.S.C. 154(b) by 268 days.

(21) Appl. No.: 18/551,386

(22) PCT Filed: Sep. 13, 2022

(86) PCT No.: PCT/IB2022/058617
§ 371 (c)(1),
(2) Date: Sep. 19, 2023

(87) PCT Pub. No.: WO2023/012772
PCT Pub. Date: Feb. 9, 2023

(65) Prior Publication Data
US 2024/0175908 A1 May 30, 2024

(30) Foreign Application Priority Data
Aug. 4, 2021 (IN) .............................. 202121035064

(51) Int. Cl.
*G01R 31/00* (2006.01)
*G01R 31/58* (2020.01)
(52) U.S. Cl.
CPC ........... *G01R 31/005* (2013.01); *G01R 31/58* (2020.01)
(58) Field of Classification Search
CPC ....... G01R 31/005; G01R 31/58; G01R 31/54
See application file for complete search history.

(56) References Cited

U.S. PATENT DOCUMENTS

| | | | | |
|---|---|---|---|---|
| 2004/0232919 A1 * | 11/2004 | Lacey | .................... | G01R 31/11 |
| | | | | 324/533 |
| 2010/0010758 A1 | 1/2010 | Kinahan | | |
| 2013/0162262 A1 | 6/2013 | Johnson et al. | | |
| 2016/0377665 A1 * | 12/2016 | Caravella | ............. | G01R 1/0416 |
| | | | | 324/539 |
| 2017/0370987 A1 * | 12/2017 | Lussier | .................. | H01R 43/18 |
| 2020/0174058 A1 * | 6/2020 | Schmier | ................. | G01R 31/69 |
| 2021/0274649 A1 * | 9/2021 | Szelest | .................. | H01R 12/75 |

FOREIGN PATENT DOCUMENTS

| | | | | |
|---|---|---|---|---|
| CN | 201307060 Y | * | 9/2009 | |
| JP | 3829651 B2 | * | 10/2006 | |
| JP | 2007132682 A | * | 5/2007 | |

* cited by examiner

*Primary Examiner* — Feba Pothen
(74) *Attorney, Agent, or Firm* — Vani Moodley, Esq.

(57) ABSTRACT

The present invention provides a rig (100a) for comparing wire harnesses (300a or 300b). The rig (100a) includes a workbench (110), two or more terminals (120a, 120b), an electrical supply (140), a supply device (145), one or more control units (150a, 150b) and a workstation (160). The control unit (150a) is connected to the respective terminal (120a) for sensinge electrical parameters at the respective terminal (120a). The workstation (160) is connected to the control units (150a, 150b) through a wireless connection. The workstation (160) is having a memory unit (168) and a processor (166). The processor (166) compares the sensed signals from the control units (150a, 150b) with the pre-stored details of the first wire harness (300a). The processor (166) provides comparison details of a first wire harness (300a) and a second wire wire harness (300b) through a display (170). The rig (100a) is easy to operate.

9 Claims, 10 Drawing Sheets

164c

164d

210

210a — Start

210b — A first wire harness is connected to terminals of a rig.

210c — The terminals are provided with the electric supply.

210d — A workstation of the rig collects information about sensed electrical parameter(s) at the terminals.

210e — The collected information is stored as the circuitry details in a memory unit of the workstation.

210f — END

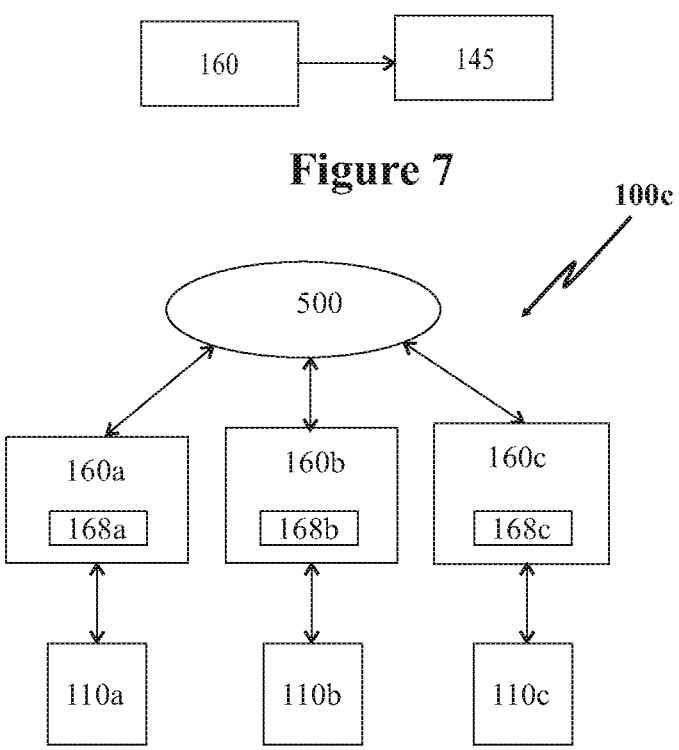
160
→
145
Figure 7
100c
500
160a
168a
160b
168b
160c
168c
110a
110b
110c
Figure 8
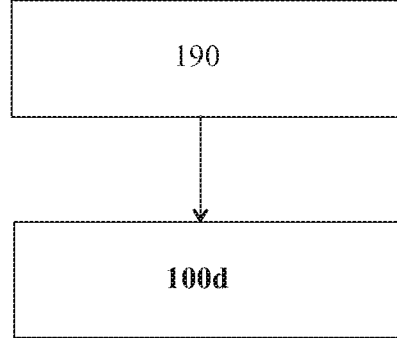
190
100d
Figure 9

RIG FOR COMPARING WIRE HARNESSES

FIELD OF THE INVENTION

The present invention provides a rig for wire harnesses. More specifically, the present invention provides a rig for comparing two or more wire harnesses.

BACKGROUND OF THE INVENTION

Generally, Wire harness(es) are typically used to provide electrical connectivity or any such connectivity and transmit signals (control signals) between functional units of devices in an aircraft, a spacecraft, a vehicle, a boat and the like. Further, the wire harness is used in wide applications such as electronic devices, home appliances, home automation systems, automobiles, construction machinery and the like. Typically, a wire harness includes one or more wire segments, and two or more connector ends. Two or more connector ends one or more wire segments.

Presently, after manufacturing a wire harness, the wire harness is compared with a standard wire harness (generally referred to as a "Master circuit" in the wire harness industry) by subjecting the wire harness to supply one or more electrical parameters thereto. Electrical parameters are an electromotive force (emf) or an electrical potential or charge or voltage or current or resistance or impedance or capacitance or utility frequency or combinations. The measured values of electrical parameters of the wire harness are compared with measured values of electrical parameters of the standard wire harness. Generally, in the wire harness industry, this process is referred to as "wire harness testing".

Presently, to test (compare) wire harnesses, some testing rigs are available. The existing testing rigs include a workbench, a processor for comparing, two or more terminals arranged on the workbench. The terminals are adapted to receive one or more connector ends of the wire harness, and each terminal is electrically coupled with a supply device. The supply device is adapted to supply one or more electrical parameters to one or more terminals when the supply device is operated accordingly. In the presently available testing rigs, the connections between the processor, the terminals and the supply device are wired. Due to the wired connections, the construction of the testing rig is complex, which makes the rig costlier. The construction of the available testing rigs is complicated and not easy to operate.

For every new requirement (to compare a new wire harness with a standard wire harness), a new test rig needs to be constructed (prepared). Hence, there is an additional cost for a new rig for every modified wire harness that needs to be tested. This construction of a new rig for every new wire harness increases the testing and ultimately the overall manufacturing cost of the wire harness.

Presently, some test rigs with wireless connections between the terminals coupled with connector ends of the wire harness.

The patent document TW202036014A discloses a "Wireless electronic-control system". The control system fails to save details of a standard wire harness provided. Also, the control system is not suitable for testing a new wire harness using the same workbench and related arrangements of the system provided.

Therefore, there is a need for a rig, which overcomes problems from the prior art.

OBJECTS OF THE INVENTION

An object of the present invention is to provide a rig for wire harnesses.

An object of the present invention is to provide a rig for wire harnesses, wherein the rig is used to compare two or more wire harnesses.

Another object of the present invention is to provide a rig for wire harnesses, wherein the rig is simple in construction compared to existing testing rigs.

Further object of the present invention is to provide a rig for wire harnesses, wherein the rig reduces the testing cost of wire harnesses compared to existing testing rigs.

Further, an object of the present invention is to provide a rig for wire harnesses, wherein the rig is easy to operate.

Also, an object of the present invention is to provide a rig for wire harnesses, wherein the rig provides various ways, or modes of storing standard wire harness details in a memory unit of the rig for comparing with other wire harnesses, the details of comparisons can be used to track errors occurred (manual or operational errors) during testing (comparison) operations.

SUMMARY OF THE INVENTION

The present invention provides a rig for comparing wire harnesses. The rig includes a workbench, two or more terminals, an electrical supply, a supply device, one or more control units and a workstation.

The terminals are arranged on the workbench. The terminals are adapted to receive one or more connector ends of the wire harness. Each wire harness includes one or more wire segments, and two or more connector ends. The connector ends connect one or more wire segments. Each terminal is electrically coupled with an electric supply. The each terminal is connected to the supply device for receiving electrical parameters therefrom. The electrical parameter is an electrical continuity, an electromotive force (emf) or electrical potential or charge or resistance or impedance or capacitance or utility frequency along with the first or second wire harness.

When the first wire harness is connected to the terminals, the electric supply is supplied from a first terminal to a second terminal through the first wire harness in a first cycle of supply. Also, the electric supply is supplied from the second terminal to the first terminal through the first wire harness in a second cycle of supply.

The control unit is connected to the respective terminal. The control unit is adapted to sense electrical parameters at the respective terminal.

The workstation is connected to the control units through a wireless connection. The workstation is a computer or a mobile or a tablet or a smartphone or a kiosk, or an IoT device. In a preferred embodiment, the wireless connection is wifi. In an alternative embodiment, the wireless connection is an internet or a radio frequency connection. In the preferred embodiment, a topology of the wireless connection is a mesh topology. In an alternative embodiment, the topology of the wireless connection can be a partially connected mesh, a ring topology, a dual ring topology, a star topology, an extended star topology, a tree topology, a bus topology, hybrid topologies or a combination thereof.

The workstation is having a memory unit and a processor. The memory unit stores prestored circuitry details of the first wire harness. The details of circuitry include a number of junctions (nodes), a number of wire segments, connectivity between the wire segments, an electrical continuity or voltage drop along with the wire segments and also along with the wire harness. Further, the details of circuitry include charge density in the junctions when the wire harness is supplied with a predefined quantity of current. The workstation receives sensed signals from the control units. Further, the workstation sends actuation signals to the control units.

In a preferred embodiment of the control unit, the control unit includes a transceiver and a sensing unit. The transceiver receives signals from the workstation and sends signals to the workstation. The sensing unit senses the electrical parameter. The sensing unit is electrically coupled to the terminal. The sensing unit is connected to the transceiver for sending sensed signals to the transceiver.

In an alternative embodiment of the control unit, the control unit also includes a regulating unit. The regulating unit is connected to the transceiver, the supply device and the respective terminal. As per the instructions received at the transceiver from the work station, the control unit regulates the supply of electric parameters to the terminal from the supply device.

In a preferred embodiment, the control unit is powered by the supply device. The supply device is a battery. In a preferred embodiment, the supply device has an interface for controlling operations of the supply device.

In a preferred embodiment, the circuitry details are stored in the memory unit by connecting the first wire harness to the corresponding terminals. Further, the terminals are provided with an electric supply. The workstation collects information about the sensed electrical parameter(s) at the terminals. The collected information is stored as the circuitry details in the memory unit of the work station. Upon storing the circuitry details of a first wire harness stored in the memory unit, the workstation modifies the connections between the terminals according to the first wire harness by actuating and nullifying the respective control units.

In one more alternative embodiment, upon storing the circuitry details of a first wire harness stored in the memory unit, the workstation modifies the connections between the terminals according to the first wire harness by sending the instructions to the transceiver to actuate the control unit for regulating the supply of electric parameters to the terminal from the supply device according to the first wire harness.

Upon connecting a second wire harness to the respective terminals, the electric supply is supplied to the terminals. When the second wire harness is connected to the terminals, the electric supply is supplied from the first terminal to the second terminal through the second wire harness in a third cycle of supply. Also, the electric supply is supplied from the second terminal to the first terminal through the second wire harness in a fourth cycle of supply.

The control units send sensed signals to the workstation. The processor compares the sensed signals from the control units with the prestored circuitry details of the first wire harness. The processor provides comparison details through a display connected therewith.

In an alternative embodiment, the work station is connected to the supply device to control the electric supply from the supply device. In an alternative embodiment, the workstation has a user interface to configure the circuitry details of the first wire harness.

In one more alternative embodiment, the circuitry details are stored in the memory unit by connecting the memory unit to an external device. The external device is a pen drive or a hard drive or a server or a cloud, or an IoT device.

In one more alternative embodiment of the rig, the rig includes a plurality of workstations and a plurality of workbenches. The work stations are connected to a server or a cloud server, the circuitry details of the first wire harness are updated in the respective memory units of workstations.

The details of comparison, cycles of comparisons are updated in a cloud memory of the cloud server in real-time.

Furthermore, in an alternative embodiment of the rig, the rig is connected to anauthentication system. The authentication system is adapted to provide access to the rig to an authenticated user only when the authentication system is operated accordingly.

The present invention also provides a method for comparing wire harnesses. The method includes a step of arranging the two or more terminals on the workbench. The terminals are adapted to receive one or more connector ends of the wire harness. The each terminal is electrically coupled with the electric supply. Further, one terminal is connected with the control unit of one or more control units. The control units are connected to a workstation through a wireless network. The workstation is having a memory unit and a processor. Furthermore, the circuitry details of the first wire harness of the wire harnesses are stored in the memory unit.

The second wire harness of the wire harnesses is connected to the terminals. The electric supply is supplied to the terminals, thereby supplying the electrical parameters to the second wire harness. The control units are adapted to send information about the sensed electrical parameter(s) at the terminals to the work station through the wireless network. The processor is adapted to compare the received information from the control units with the prestored circuitry details of the first wire harness. The processor is adapted to provide comparison details through a display connected therewith.

BRIEF DESCRIPTION OF THE DRAWINGS

The advantages and features of the present invention will be understood better with reference to the following detailed description of some embodiments and claims taken in conjunction with the accompanying drawings, wherein like elements are identified with like symbols, and in which;

FIG. 2 shows a schematic block diagram of a control unit of the rig shown in FIG. 1a;

FIG. 7 shows a schematic block diagram of an alternative embodiment connection between the workstation and the supply device shown in FIG. 5, FIG. 1*a* and FIG. 1*b;*

FIG. 8 shows a schematic block diagram of an alternative embodiment of a rig for comparing wire harnesses in accordance with the present invention;

FIG. 9 shows a schematic block diagram of one more alternative embodiment of a rig for comparing wire harnesses in accordance with the present invention.

DETAILED DESCRIPTION OF THE INVENTION

An embodiment of this invention, illustrating its features, will now be described in detail. The words "comprising", "having", "containing," and "including," and other forms thereof are intended to be equivalent in meaning and be open-ended in that an item or items following any one of these words is not meant to be an exhaustive listing of such item or items or meant to be limited to only the listed item or items.

The terms "first," "second," and the like, herein do not denote any order, quantity, or importance, but rather are used to distinguish one element from another, and the terms "an" and "a" herein do not denote a limitation of quantity, but rather denote the presence of at least one of the referenced items.

The disclosed embodiments are merely exemplary of the invention, which may be embodied in various forms.

The present invention provides a rig for wire harnesses. The rig is used to compare two or more wire harnesses. The rig is simple in construction compared to existing testing rigs. The rig reduces the testing cost of wire harnesses compared to existing testing rigs. The rig is easy to operate. The rig provides various ways or modes of storing standard wire harness details in a memory unit of the rig for comparison with other wire harnesses.

Figure 1A:
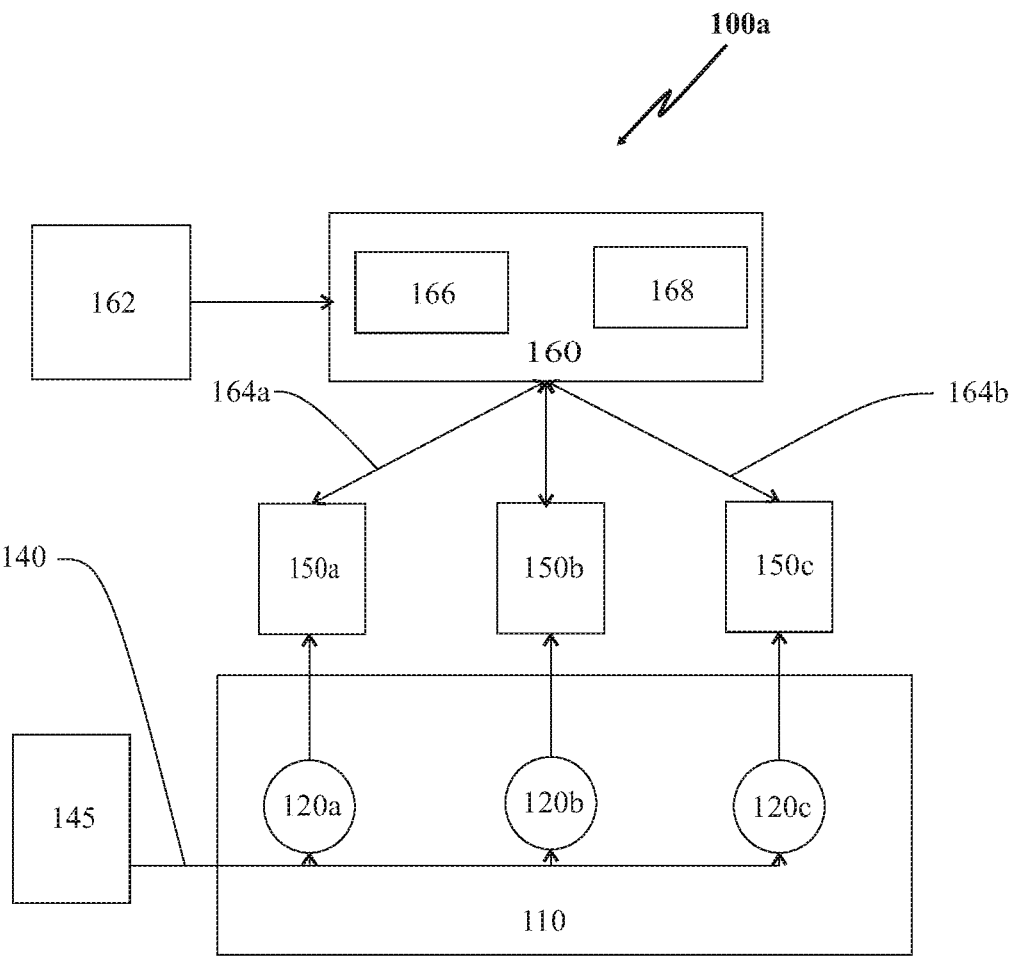
FIG. 1a shows a schematic block diagram of a rig for comparing wire harnesses in accordance with the present invention.

Referring to FIG. 1*a*, a schematic view of a rig for comparing wire harnesses in accordance with the present invention is illustrated. From herein afterwards, the rig is referred to as a rig (100*a*). The rig (100*a*) is for wire harnesses (300*a* or 300*b*) (FIGS. 1*g*, 1*h*, 1*i* and 1*j*). The rig (100) includes a workbench (110), two or more terminals (120*a*, 120*b*, 120*c*), an electrical supply (140), a supply device (145), one or more control units (150*a*, 150*b*, 150*c*) and a workstation (160).

Generally, the terminals (120*a*, 120*b*) are arranged on the workbench (110). In a preferred embodiment, the terminals (120*a*, 120*b*) are fixed to the workbench (110). In one more embodiment, the terminals (120*a*, 120*b*) are movably arranged on the workbench (110). The terminals (120*a*, 120*b*) are adapted to receive one or more connector ends (302*a*, 304*a*, 302*b*, 304*b*) of the wire harness (300*a*, 300*b*) (refer to FIGS. 1*g* and 1*h*). Each wire harness (300*a*, 300*b*) includes one or more wire segments (310*a*, 310*b*) and two or more connector ends (302*a*, 304*a*, 302*b*, 304*b*). The connector ends (302*a*, 304*a*, 302*b*, 304*b*) connects one or more wire segments (310*a*, 310*b*). For example, connector ends (302*a*, 304*a*) connects the wire segment (310*a*).

Each terminal (120*a*, 120*b*) is electrically coupled with an electric supply (140). The each terminal (302*a*, 304*a*) is connected to the supply device (145) for receiving electrical parameters therefrom. The electrical parameter is an electrical continuity, an electromotive force (emf) or electrical potential or charge or resistance or impedance or capacitance or utility frequency along with the first or second wire harness (300*a* or 300*b*). For example, the wire harness (300*a* or 300*b*) is supplied with 5 Ampere of electric current and 5 Volts of electric voltage. Generally, for continuity testing, the wire is supplied with a few amperes of electrical current.

When the first wire harness (300*a*) is connected to the terminals (120*a*, 120*b*), the electric supply (140) is supplied from a first terminal (120*a*) to a second terminal (120*b*) through the first wire harness (300*a*) in a first cycle of supply (801). Also, the electric supply (140) is supplied from the second terminal (120*b*) to the first terminal (120*a*) through the first wire harness (300*a*) in a second cycle of supply (802). The first wire harness (300*a*) can be standard if the rig (100*a*) is used to harness testing operations. Generally, in the industry (wire harness industry), the first wire harness (300*a*) is referred to as a "master circuit" if the rig (100*a*) is used for the wire harness testing operations.

The control unit (150*a* or 150*b*) is connected to the respective terminal (120*a*, 120*b*). The control unit (150*a*, 150*b*) is adapted to sense electrical parameters at the respective terminal (120*a*, 120*b*).

Figure 1B:
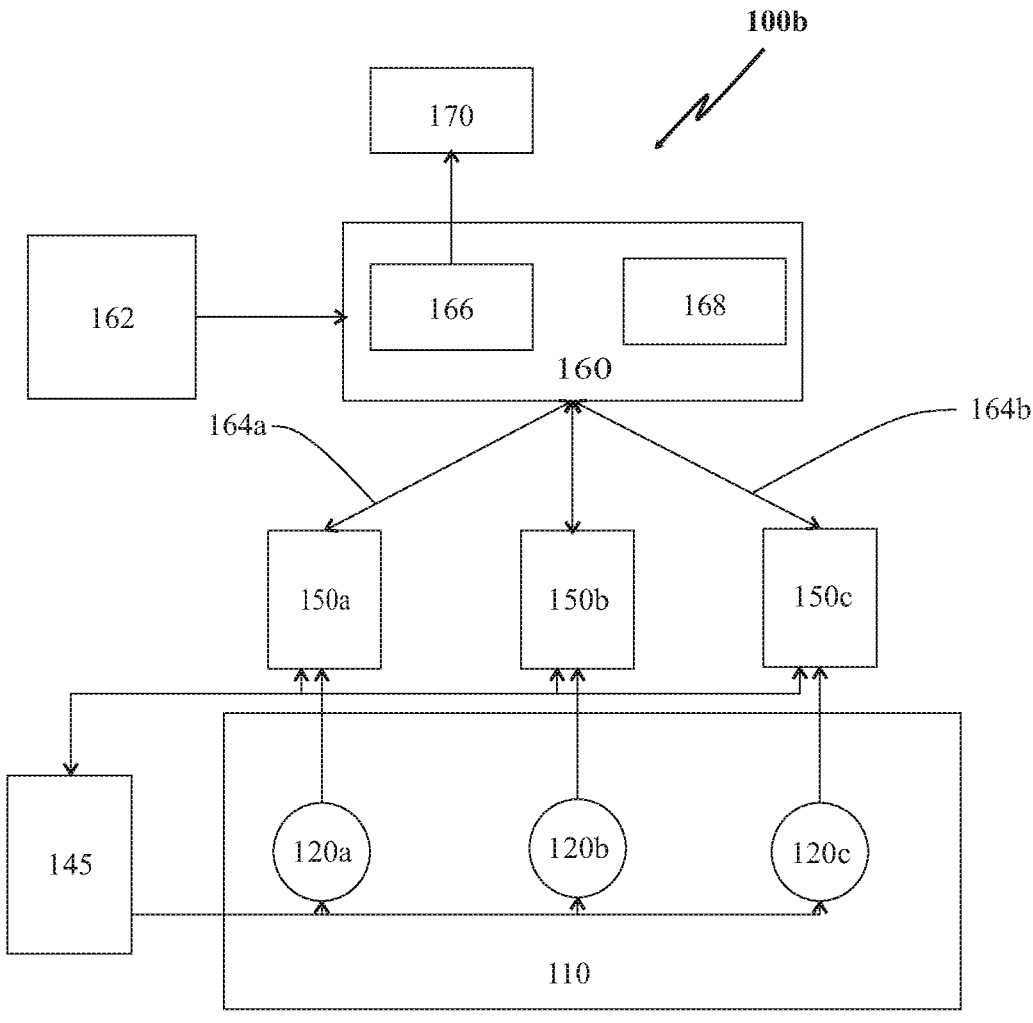
FIG. 1b shows a schematic block diagram of an alternative embodiment of a rig for comparing wire harnesses in accordance with the present invention.
Figure 1C:
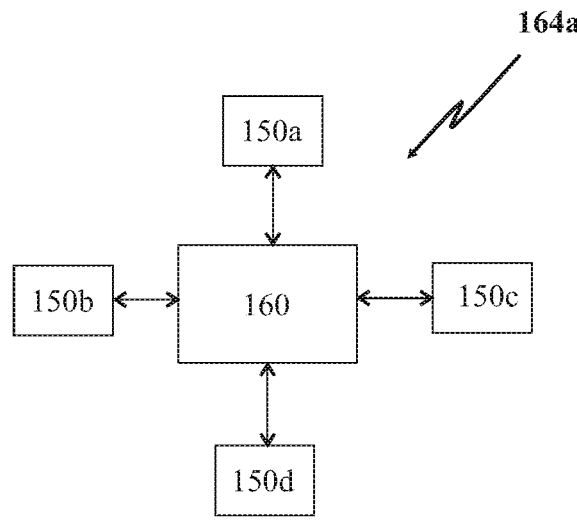
FIG. 1c shows a schematic block diagram of a star topology network between control units and a work station of the rig shown in FIGS. 1a and 1b.
Figure 1D:
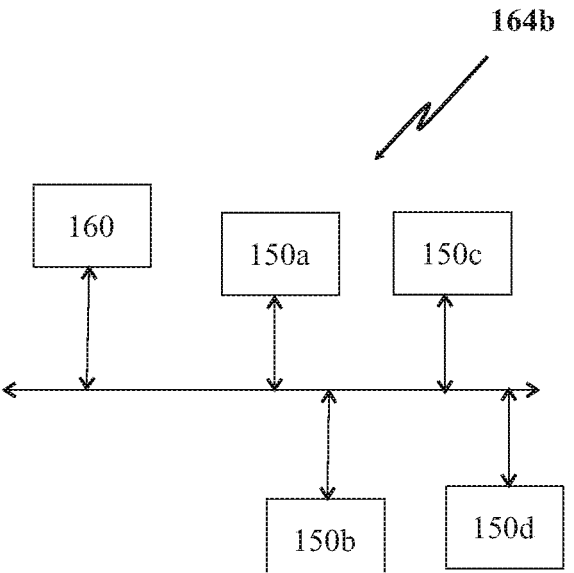
FIG. 1d shows a schematic block diagram of a bus topology network (alternative embodiment) between control units and a work station of the rig shown in FIGS. 1a and 1b.
Figure 1E:
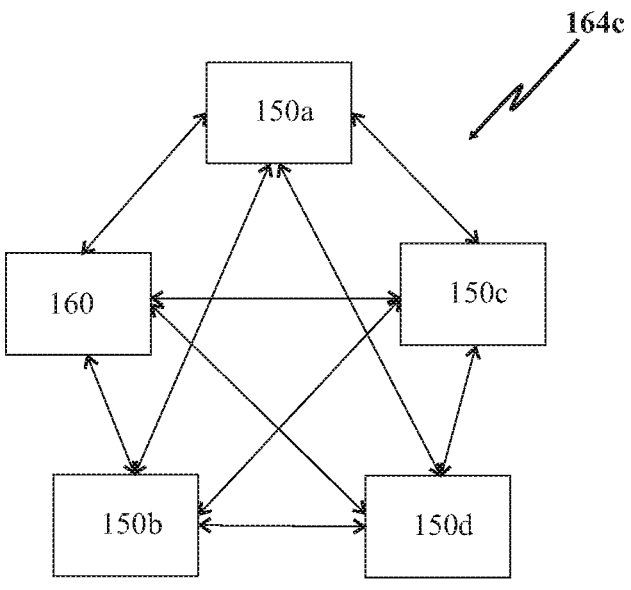
FIG. 1e shows a schematic block diagram of a mesh topology network (alternative embodiment) between control units and a work station of the rig shown in FIGS. 1a and 1b.
Figure 1F:
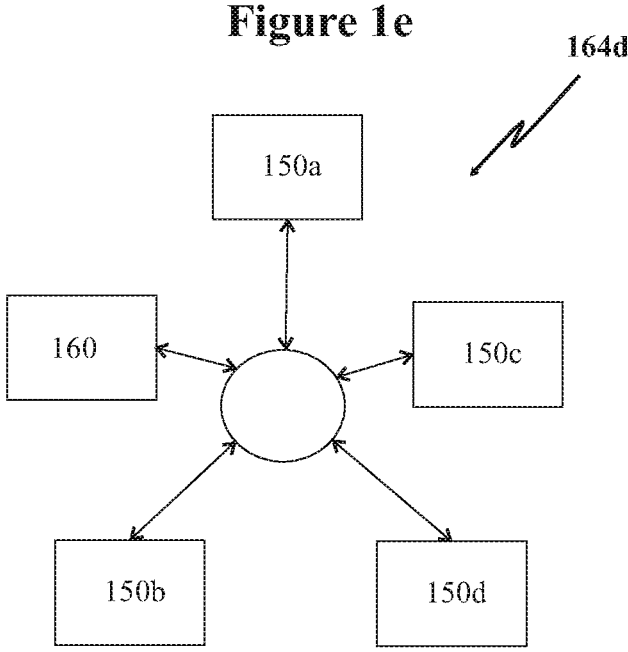
FIG. 1f shows a schematic block diagram of a ring topology network (alternative embodiment) between control units and a work station of the rig shown in FIGS. 1a and 1b.
Figures 1G, 1H:
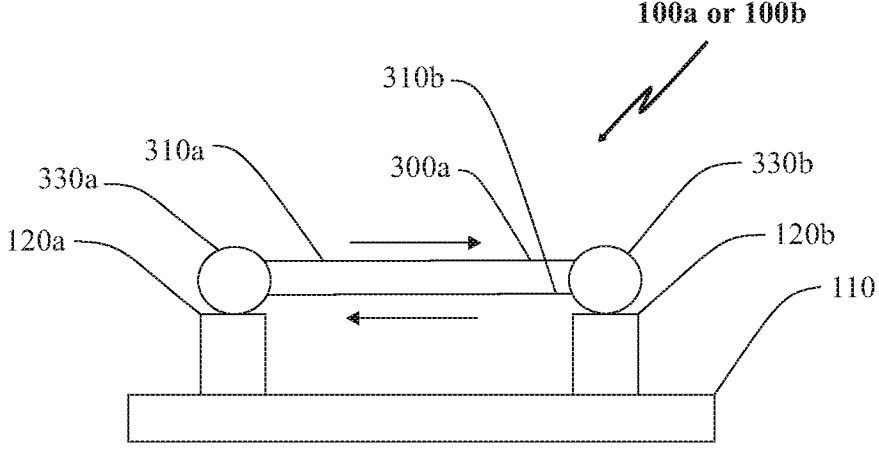
FIGS. 1g and 1i show a schematic front view and a schematic top view of a first wire harness connected to terminals of the rig shown in FIGS. 1a and 1b.
FIGS. 1h and 1j show a schematic front view and a schematic top view of a second wire harness connected to terminals of the rig shown in FIGS. 1a and 1b.
Figure 1I:
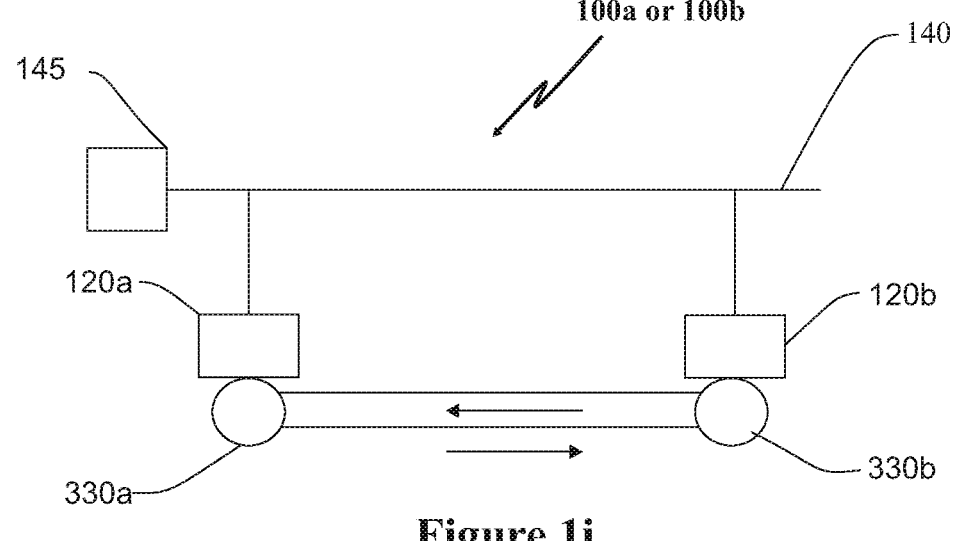
Figure 1J:
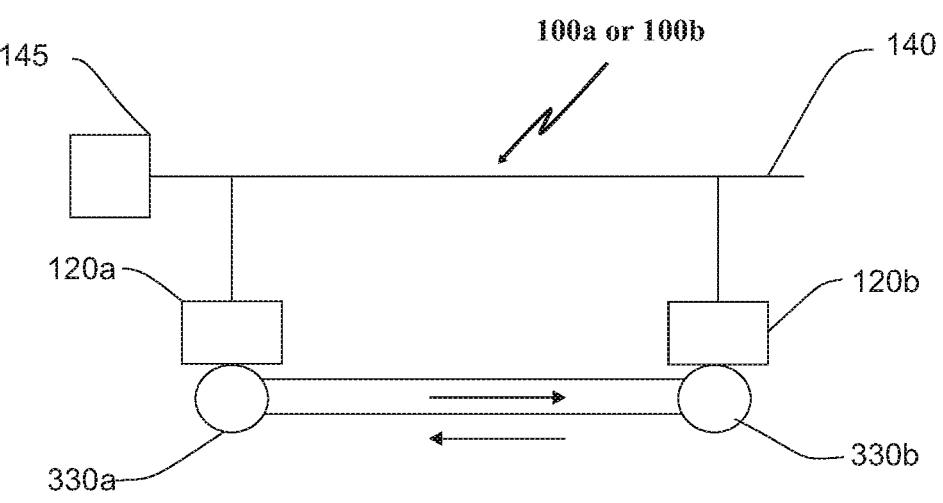

The workstation (160) is connected to the control units (150*a*, 150*b*) through a wireless connection (164). The workstation (160) is a computer or a mobile or a tablet or a smartphone or a kiosk, or an IoT (Internet Of Things) device. In a preferred embodiment, the wireless connection (164) is wifi (Wireless Fidelity). In an alternative embodiment, the wireless connection (164) is an internet or a radio frequency connection. In the preferred embodiment, as shown in FIG. 1*c*, a topology of the wireless connection (164) is a star topology (164*a*). In an alternative embodiment, the topology of the wireless connection (164) can be a partially connected mesh, a ring topology (164*d*) (refer to FIG. 1*f*), a dual ring topology, a star topology (164*a*) (refer to FIG. 1*c*), an extended star topology, a tree topology, a bus topology (164*b*) (refer FIG. 1*d*), a mesh topology (164*c*) (refer FIG. 1*e*), hybrid topologies or combination thereof.

Further, the workstation (160) is having a memory unit (168) and a processor (166). The processor (166) is connected to the memory unit (168). The memory unit (168) stores prestored circuitry details of the first wire harness (300*a*). The details of circuitry include a number of junctions (nodes), a number of wire segments (310*a*, 310*b*), connectivity between the wire segments (310*a*, 310*b*), an electrical continuity or voltage drop along with the wire segments (310*a*, 310*b*) and also along with the wire harness (300*a*, 300*b*). Further, the details of circuitry include charge density in the junctions when the wire harness (300*a*, 300*b*) is supplied with a predefined quantity of current.

Further, the circuitry details include measured electric parameters at respective terminals (120*a* or 120*b*). In a given an example, the circuitry details of the first wire harness (300*a*) shown in FIG. 1*g* include a supply voltage of 5V, a current of 5 A, two junctions, the energy of 5J and the like. The circuitry details can be modified based on requirements by varying the supplied parameters.

The workstation (160) receives sensed signals from the control units (150*a*, 150*b*). Further, the workstation (160)

sends actuation signals to the control units (150a, 150b). Each control unit (150a, 150b) is embedded with a set of hardware and software.

Figure 2:
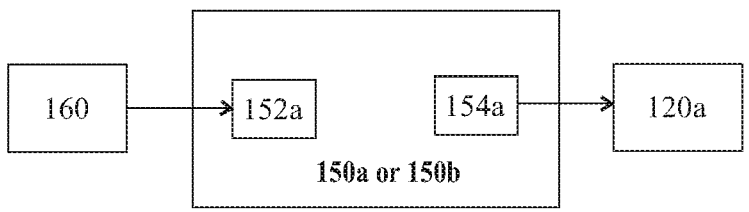

In a preferred embodiment of the control unit (150a, 150b), the control unit (150a, 150b) includes a transceiver (152a, 152b) and a sensing unit (154a, 154b) (refer FIG. 2). The transceiver (152a, 152b) includes a receiver receiving signals from the workstation (160). The transceiver (152a, 152b) includes a transmitter for sending signals to the work station (160). The transceiver (152a, 152b) receives and sends information through the wireless network (164). The sensing unit (154a, 154b) senses the electrical parameter. The sensing unit (154a, 154b) is electrically coupled to the terminal (120a, 120b). The sensing unit (154a, 154b) is connected to the transceiver (152a, 152b) for sending sensed signals to the transceiver (152a, 152b). The sensing unit (154a, 154b) can be an electrical sensor or a detector or a transducer.

Figure 3:
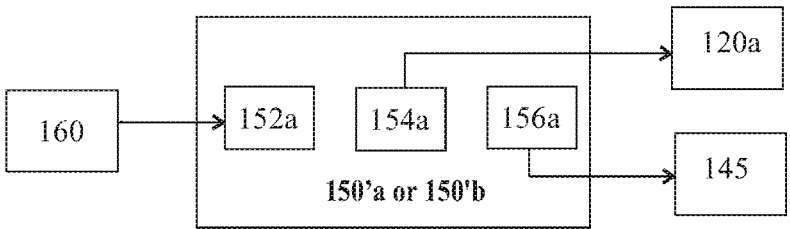
FIG. 3 shows a schematic block diagram of a control unit of the rig shown in FIG. 1b.

In an alternative embodiment of the control unit (150'a, 150'b) (FIG. 3), the control unit (150'a, 150'b) also includes a regulating unit (156a, 156b). The regulating unit (156a, 156b) includes a voltage regulator, transformers, diodes, relays, electric switches, or any other functional units adapted to regulate the electric supply parameter(s) together or separately. The regulating unit (156a, 156b) is connected to the transceiver (152a, 152b), the supply device (145) and the respective terminal (120a, 120b) (FIG. 1b). As per the instructions received at the transceiver (152a, 152b) from the work station (160), the control unit (150'a, 150'b) regulates the supply of electric parameters to the terminal (120a, 120b) from the supply device (145).

Figure 5:
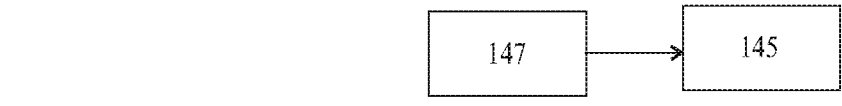
FIG. 5 shows a schematic block diagram of an alternative embodiment of the supply device shown in FIG. 4.
Figure 4:
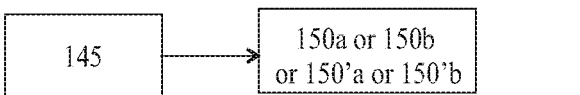
FIG. 4 shows a schematic block diagram of a connection between a supply device and control units of the rig shown in FIGS. 1*a* and 1*b;*

In a preferred embodiment, the control unit (150a, 150á 150b, 150'b) is powered by the supply device (145) (FIG. 4). The supply device (145) is a battery. In one more embodiment, the supply device (145) is having an interface (147) for controlling operations of the supply device 145 (FIG. 5). A user can operate the supply device (145) through the interface (147) for supplying the required electric parameters.

Figure 6:
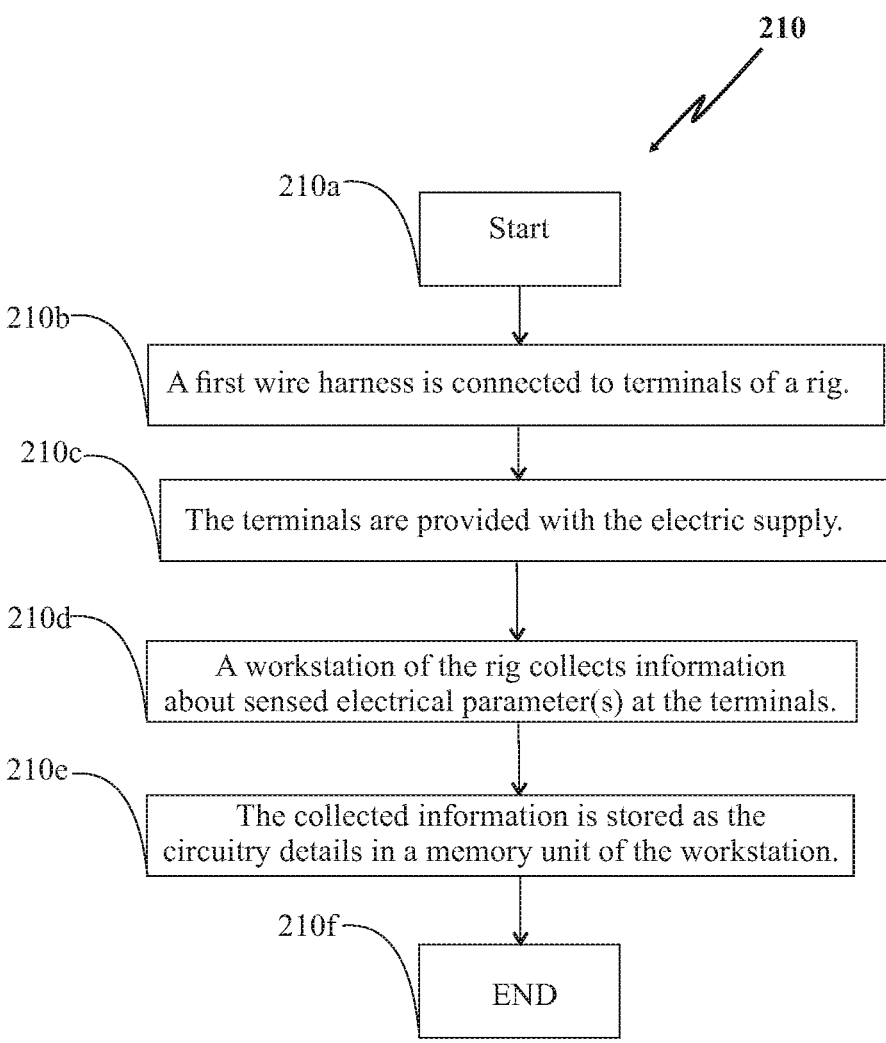
FIG. 6 shows a flow chart showing various steps carried out in a method for storing circuitry details in a memory unit of a workstation of the rig shown in FIG. 1*a* and FIG. 1*b;*

Referring now to FIG. 6, showing a flow chart of a method (210) for storing the circuitry details in the memory unit (168). The method (210) is a preferred method to store the circuitry details in the memory unit (168). The method starts at step 210a. At step 210b, the first wire harness (300a) is connected to the corresponding terminals (120a, 120b) (refer to FIG. 1g). Further, at step 210c, the terminals (120a, 120b) are provided with an electric supply (140) (refer to FIG. 1i)). At step 210d, the workstation (160) collects information about sensed electrical parameter(s) at the terminals (120a, 120b). Furthermore, at step 210e, the collected information is stored as the circuitry details in the memory unit (168) of the work station (160).

In an alternative embodiment, the workstation (160) has a user interface (162) (FIG. 1a) to configure the circuitry details of the first wire harness (300a). The workstation (160) is having software such as Electrical computer-aided design and drafting (E-CADD) software, computer-aided engineering (CAE) software and Computer-Aided Manufacturing (CAM) software. Using this software, a user can configure the circuitry details of the first wire harness (300a) in the work station (160).

In one more alternative embodiment, the circuitry details are stored in the memory unit (168) by connecting the memory unit (168) to an external device (not shown). The external device (400) is a pen drive or a hard drive or a server or a cloud, or an IoT device.

Upon storing the circuitry details of the first wire harness (300a) in the memory unit (168), the workstation (160) modifies the connections between the terminals (120a & 120b) according to the first wire harness (300a) by actuating and nullifying the respective control units (150a, 150b). This way of nullification can be seen in the embodiment shown in FIG. 1a (the rig (100a)).

Though the supply device (145) supplies electric supply (140) to the terminals (120a, 120b), the control units (150a, 150b, 150c) are not able to sense the signals from electric supplied terminals (120a, 120b, 120c) due to nullification of the respective control units (150a, 150b, 150c).

In the shown example (refer to FIG. 1a), the first circuitry details include only two or more connector ends (302a, 304a). The electric supply (140) is supplied to all terminals (120a, 120b, 120c). Even though the terminals (120a, 120b, 120c) are supplied with the electric supply (140), the respective control unit (150c) connected with the terminal (120c) can be nullified. The nullified control unit (150c) cannot sense the signal from the electric supplied terminal (120c).

In one more alternative embodiment of the rig (100b) (FIG. 1b), upon storing the circuitry details of the(a) first wire harness (300a) stored in the memory unit (168), the workstation (160) modifies the connections between the terminals (120a) according to the first wire harness (300a) by sending the instructions to the transceiver (152a) to actuate the control unit (150'a) for regulating the supply of electric parameters to the terminal (120a) from the supply device (145) according to the first wire harness (300a). This working of the control unit (150'a, 150'b, 150'c) is shown in FIG. 4. As the control units (150'a, 150'b, 150'c) regulates the supply device (145), the electric supply (140) is supplied and controlled to the respective terminals (120a, 120b) by the control units (150'a, 150'b, 150'c) connected therewith. In the shown example of harness (FIG. 1g, 1i), the terminal (120c) can be nullified by the control unit (150'c), as the control unit (150'c) stops the electric supply (140) to the terminal (120c).

For comparing the first wire harness (300a) (for testing the wire harness) with the second wire harness (300b), the second wire harness (300b) is connected to the respective terminal (120a, 120b) (FIGS. 1h and 1j), Upon connecting the second wire harness (300b) to the respective terminals (120b), the electric supply (140) is supplied to the terminals (120b). When the second wire harness (300b) is connected to the terminals (120a, 120b), the electric supply (140) is supplied from the first terminal (120a) to the second terminal (120b) through the second wire harness (300b) in a third cycle of supply (803). Also, the electric supply (140) is supplied from the second terminal (120b) to the first terminal (120a) through the second wire harness (300b) in a fourth cycle of supply (804).

The control units (150a, 150b, 150á, 150b) sends sensed signals to the workstation (160). The processor (166) compares the sensed signals from the control units (150b) with the prestored circuitry details of the first wire harness (300a). The processor (166) provides comparison details through a display (170) connected therewith (refer to FIG. 1b). The processor (166) is embedded with a set of hardware and software to compare the first wire harness and the second wire harness.

Similarly, the details of the first wire harness (300a) are compared with the second wire harness (300b). For every new testing requirement, the details of a new first wire harness (300a) are stored (modified) in the memory unit (168). The respective comparison (testing) activity is carried on the second wire harness (300b) in comparison to the first harness (300a).

The comparison details include the difference between electrical parameters measured along with the first wire harness (300a) and the second wire harness (300b). In a given example, the first wire harness (300a) has a 5A current, 5V voltage at the first end terminal (120a). The second wire harness (300b) has a 4A current, 4V voltage at the second terminal (120b). The comparison details can be "current difference of IA and voltage difference of 1V between the first wire harness (300a) and the second wire harness (300b)". The same details can be displayed by the display (170).

These comparison details can be used for testing the wire harnesses (300a, 300b) or for manufacturing the wire harnesses, or tracking errors of comparison operations or for research and development activities.

Similarly, the number of terminals (120a, 120b, 120c) can be increased based on the total number of connector ends (302a, 304a, 302b, 304b) and other specifications of a wire harness (300a, 300b). It may be obvious to a person skilled in the art to configure the rig (100a, 100b) with the number of terminals (increased or decreased) according to the number of connector ends (302a, 304a, 302b, 304b) junctions present in the wire harness (300a, 300b) which needs to compare using the rig (100b).

In an embodiment, the work station (160) is connected to a server (not shown), the comparison details are updated in the server.

In an alternative embodiment (FIG. 7), the work station (160) is connected to the supply device (145) to control the electric supply (140) from the supply device (145).

Referring now to FIG. 8, one more alternative embodiment of the rig (100c) is illustrated. The rig (100c) includes a plurality of work stations (160a, 160b, 160c) and a plurality of workbenches (110a, 110b, 110c). The work stations (160a, 160b, 160c) are connected to a server (500) or a cloud server, the circuitry details of the first wire harness (300a) is updated in the respective memory units (168a, 168b, 168c) of workstations (160a, 160b, 160c). The details of comparison, cycles of comparisons are updated in a cloud memory of the cloud server in real-time.

The details of comparisons can be used to track errors occurred (manual or operational errors) during testing (comparison) operations.

In one more alternative embodiment of the rig (100d), the rig (100d) is connected to an authentication system (190) (refer to FIG. 9). The authentication system (190) is adapted to provide access to the rig (100d) to an authenticated user only when the authentication system (190) is operated accordingly.

Figure 10:
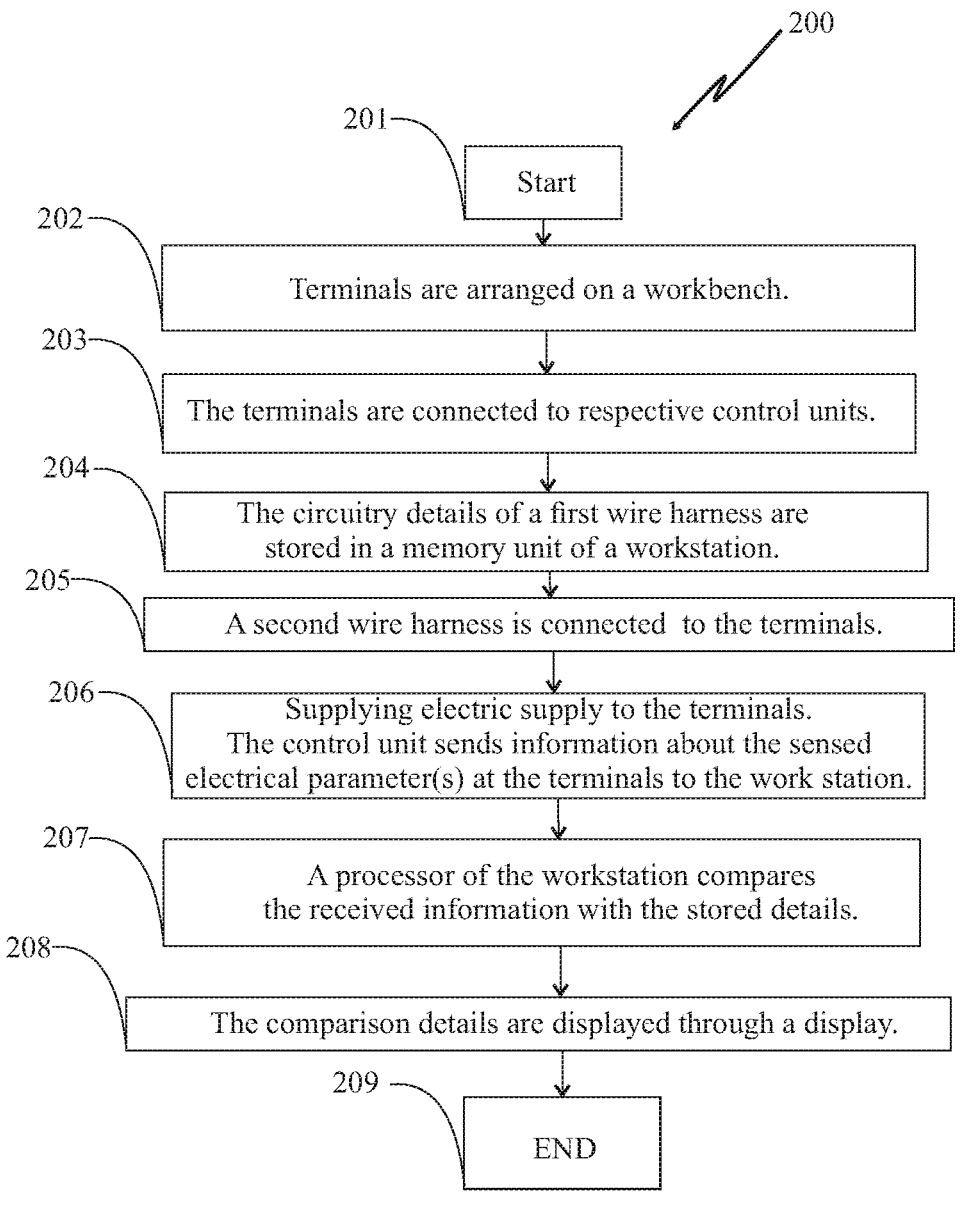
FIG. 10 shows a flow chart showing various steps carried out in a method for comparing wire harnesses in accordance with the present invention.

The present invention provides a method (200) (refer to FIG. 10) for comparing wire harnesses (300a, 300b) (refer to FIG. 10).

The method (200) starts at step 201.

At step 202, the two or more terminals (120a, 120b) are arranged on the workbench (110).

At step 203, the terminals (120a & 120b) are adapted to receive one or more connector ends (302a, 3024, 302b, 304b) of the wire harness (300a, 300b). The each terminal (120a, 120b) is electrically coupled with the electric supply (140). Further, one terminal (120a, 120b) is connected with the control unit (150a, 150b) of the one or more control units (150a, 150b). The control units (150a, 150b) are connected to a workstation (160) through a wireless network (164). The workstation (160) is having the memory unit (168) and the processor (166).

Further, at step 204, the circuitry details of the first wire harness (300a) of one or more wire harnesses (300) are stored in the memory unit (168).

At step 205, the second wire harness (300b) is connected to the terminals (120a, 120b).

At step 206, the electric supply (140) is supplied to the terminals (120a, 120b), thereby supplying the electrical parameters to the second wire harness (300b). The control units (150a, 150b) are adapted to send information about the sensed electrical parameter(s) at the terminals (120a, 120b) to the work station (160) through the wireless network (164).

At step 207, the processor (166) compares the received information from the control units (150a, 150b) with the prestored circuitry details of the first wire harness (300a).

At step 208, the processor (166) is adapted to provide comparison details through the display (170) connected therewith. The method (200) ends at step 209.

Therefore, the present invention has the advantage of providing the rig (100a, 100b, 100c, 100d) for the wire harnesses (300a, 300b). The rig (100, 100b, 100c, 100d) is used to compare two or more wire harnesses (300a and 300b). The present test rig (100, 100b, 100c, 100d) is used for comparing a single standard wire harness (300a) with multiple other wire harnesses (300b) with modification in circuitry details or vice-versa. As there is a wireless connection (164) is between the control units (150a, 150b, 150'a, 150'b) and the processor (166), the rig (100a, 100b, 100c, 100d) is simple in construction compared to existing testing rigs.

For every new testing (comparison) requirement, the details of a new first wire harness (300a) are stored (modified) in the memory unit (168). The respective comparison (testing) activity is carried on a second wire harness (300b) in comparison to the first harness (300a). Therefore, a new rig is not required for a new requirement of comparing new wire harnesses. Hence, the rig (100) reduces the testing cost of the wire harness (300a, 300b) compared to existing testing rigs (prior arts). The rig (100) is easy to operate. The rig (100a, 100b, 100c, 100d) provides various ways or modes of storing standard wire harness (300) details in a memory unit (168) of the rig (100a, 100b, 100c, 100d) for comparing with other wire harnesses.

The foregoing descriptions of specific embodiments of the present invention have been presented for purposes of illustration and description. They are not intended to be exhaustive or limit the present invention to the precise forms disclosed, and obviously, many modifications and variations are possible in light of the above teaching. The embodiments were chosen and described to best explain the principles of the present invention and its practical application and thereby enable others skilled in the art to best utilise the present invention and various embodiments with various modifications as are suited to the particular use contemplated. It is understood that various omissions and substitutions of equivalents are contemplated as circumstances may suggest or render expedient, but such omissions and substitutions are intended to cover the application or implementation without departing from the scope of the claims of the present invention.

I claim:

1. A rig (100a or 100b or 100c or 100d) for comparing wire harnesses (300a or 300b), the rig (100a or 100b or 100c or 100d) includes a workbench (110), two or more terminals (120a, 120b, 120c) arranged on the workbench (110), the terminals (120*a*, 120*b*) are adapted to receive one or more connector ends (302*a*, 304*a*, 302*b*, 304*b*) of the wire harness (300*a*, 300*b*) and a display (170), each terminal (120*a*, 120*b*) is electrically coupled with an electric supply (140);

one or more control units (150*a*, 150*b*), each control unit (150*a*, 150*b*) is connected to the respective terminal (120*a*, 120*b*), the control unit (150*a*, 150*b*) is adapted to sense electrical parameters at the respective terminal (120*a*, 120*b*) when the respective terminal (120*a*, 120*b*) is supplied with the electric supply (140) and generates sensed signals charecterised in that the rig (100*a* or 100*b* or 100*c* or 100*d*) comprises;

a workstation (160) connected to the control units (150) through a wireless connection (164) to receive sensed signals from the control units (150*a*, 150*b*) and to send actuation signals to the control units (150*a*, 150*b*), the workstation (160) is having a user interface (162) to configure a circuitry details of the first wire harness (300*a*) and a memory unit (168) for storing prestored circuitry details of a first wire harness (300*a*) and a processor (166);

wherein upon connecting a second wire harness (300*b*) to the respective terminals (120*b*) and supplying the electric supply (140) to the terminals (120*a* or 120*b*), the control units (150*a* or 150*b*) send sensed signals to the workstation (160), the processor (166) compares the sensed signals from the control units (150*a* or 150*b*) with the prestored circuitry details of the first wire harness (300*a*) and provide comparison details through the display (170) connected therewith.

2. The rig (100*a*) for wire harnesses (300*a* or 300*b*) as claimed in claim 1, wherein each wire harness includes one or more wire segments (310*a* or 310*b*) and two or more connector ends (302*a*, 304*a*, 302*b*, 304*b*), connect one or more wire segments (310*a* or 310*b*), the details of circuitry includes a number of junctions (nodes), a number of wire segments (310*a* or 310*b*), connectivity between the wire segments (310*a* & 310*b*), an electrical continuity or voltage drop along with the wire segments (310*a* & 310*b*) and also along with the wire harness (300*a*, 300*b*), charge density in the junctions when the wire harness (300*a*, 300*b*) is supplied with a predefined quantity of current.

3. The rig (100*a*) for wire harnesses (300*a* or 300*b*) as claimed in claim 1, wherein the circuitry details are stored in the memory unit (168) by connecting the first wire harness (300*a*) to the corresponding terminals (120*a*, 120*b*) and providing electric supply (140) to the first wire harness (300*a*), the workstation (160) collects information about sensed electrical parameter(s) at the terminals (120*a*, 120*b*) from the respective control unit (150*a* or 150*b*), wherein the collected information is stored as the circuitry details in the memory unit (168) of the work station (160).

4. The rig (100*a*) for wire harnesses (300*a* or 300*b*) as claimed in claim 1, wherein upon storing the circuitry details of a first wire harness (300*a*) stored in the memory (168), the workstation (160) modifies the connections between the terminals (120*a*, 120*b*, 120*c*) according to the first wire harness (300*a*) by actuating and nullifying the respective control units (150*a*, 150*b*, 150*c*).

5. The rig (100*a*) for wire harnesses (300*a* or 300*b*) as claimed in claim 1, wherein the supply device (145) is having an interface (147) for controlling operations of the supply device (145).

6. The rig (100*b*) for wire harnesses (300*a* or 300*b*) as claimed in claim 1, wherein upon storing the circuitry details of a first wire harness (300*a*) stored in the memory unit (168), the workstation (160) modifies the connections between the terminals (120*a*) according to the first wire harness (300*a*) by sending the instructions to the transceiver (152*a*) to actuate a control unit (150'*a*) for regulating the supply of electric parameters (140) to the terminal (120*a*) from the supply device (145) according to the first wire harness (300*a*).

7. The rig (100*a*) for wire harnesses (300*a* or 300*b*) as claimed in claim 1, wherein the work station (160) is connected to the supply device (145) to control the electric supply from the supply device (145).

8. The rig (100*a*) for wire harnesses (300*a* or 300*b*) as claimed in claim 1, wherein when the first wire harness (300*a*) is connected to the terminals (120*a*, 120*b*), the electric supply (140) is supplied from a first terminal (120*a*) to a second terminal (120*b*) through the first wire harness (300*a*) in the first cycle of supply (801); the electric supply (140) is supplied from the second terminal (120*b*) to the first terminal (120*a*) through the first wire harness (300*a*) in a second cycle of supply (802); and when the second wire harness (300*b*) is connected to the termainals (120*a*, 120*b*), the electric supply (140) is supplied from the first terminal (120*a*) to the second terminal (120*b*) through the second wire harness (300*b*) in a third cycle of supply (803), the electric supply (140) is supplied from the second terminal (120*b*) to the first terminal (120*a*) through the second wire harness (300*b*) in a fourth cycle of supply (801).

9. A method (200) for comparing wire harnesses (300*a* or 300*b*), the method (200) includes steps of arranging two or more terminals (120*a*, 120*b*) on the workbench (110), the terminals (120*a* & 120*b*) are adapted to receive one or more connector ends (302*a*, 304*a*, 302*b*, 304*b*) of the wire harness (300*a*, 300*b*); electrically coupling each terminal (120*a*, 120*b*, 120*c*) with an electric supply (140), connecting one terminal (120*a*, 120*b*, 120*c*) with a control unit (150*a*, 150*b*, 150*c*) of one or more control units (150*a*, 150*b*, 150*c*), characterized in that the method comprising the steps of connecting all control units (150*a*, 150*b*, 150*c*) to a workstation (160) through a wireless network (164), the workstation (160) is having a memory unit (168) and a processor (166);

storing the circuitry details of a first wire harness (300*a*) in the memory unit (168);

connecting a second wire harness (300*b*) to the terminals (120*a*, 120*b*);

supplying electric supply (140) to the terminals (120*a*, 120*b*), thereby supplying the electrical parameters to the second wire harness (300*b*), wherein the control units (150*a*, 150*b*) are adapted to send information about sensed electrical parameters(s) at the terminals (120*a*, 120*b*) to the work station (160) through the wireless network (164), the processor (166) is adapted to compare the received information from the control units (150*a*, 150*b*) with the prestored circuitry details of the first wire harness (300*a*) and provide comparison details through a display (170) connected therewith.

\* \* \* \* \*